(12) United States Patent
Robert

(10) Patent No.: US 11,267,697 B2
(45) Date of Patent: Mar. 8, 2022

(54) USE OF AN UNCOUPLING STRUCTURE FOR ASSEMBLING A COMPONENT HAVING A CASING

(71) Applicant: COMMISSARIAT A L'ENERGIE ATOMIQUE ET AUX ENERGIES ALTERNATIVES, Paris (FR)

(72) Inventor: Philippe Robert, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 74 days.

(21) Appl. No.: 16/955,159

(22) PCT Filed: Dec. 20, 2018

(86) PCT No.: PCT/FR2018/053435
§ 371 (c)(1),
(2) Date: Jun. 18, 2020

(87) PCT Pub. No.: WO2019/122733
PCT Pub. Date: Jun. 27, 2019

(65) Prior Publication Data
US 2020/0391994 A1   Dec. 17, 2020

(30) Foreign Application Priority Data
Dec. 22, 2017   (FR) ...................... 1763159

(51) Int. Cl.
| B81B 7/00 | (2006.01) |
| B81B 7/02 | (2006.01) |
| B81C 1/00 | (2006.01) |

(52) U.S. Cl.
CPC .............. B81B 7/0048 (2013.01); B81B 7/02 (2013.01); *B81B 2201/0235* (2013.01);
(Continued)

(58) Field of Classification Search
CPC . B81B 7/0048; B81B 7/02; B81B 2201/0235; B81B 2201/0242;
(Continued)

(56) References Cited

U.S. PATENT DOCUMENTS

| 6,093,330 A | * | 7/2000 | Chong ................ B81C 1/00047 216/11 |
| 2010/0244246 A1 | | 9/2010 | Caplet |

(Continued)

FOREIGN PATENT DOCUMENTS

| DE | 10 2013 211 555 A1 | 12/2014 |
| EP | 2 679 536 A2 | 1/2014 |
| WO | WO 2009/060029 A1 | 5/2009 |

OTHER PUBLICATIONS

U.S. Appl. No. 15/248,756, filed Aug. 26, 2016, US 2017/0059420 A1, Patrice Rey, et al.

(Continued)

*Primary Examiner* — Yasser A Abdelaziez
(74) *Attorney, Agent, or Firm* — Oblon, McClelland, Maier & Neustadt, L.L.P.

(57) ABSTRACT

In an assembly between a MEMS and/or NEMS electromechanical component and a casing, the electromechanical component includes at least one suspended and movable structure which is provided with at least one fixing zone, on which a region for receiving the casing is fixed, the suspended structure being at least partially formed in a cover for protecting the component or in a layer which is different from the one in which a sensitive element of the component is formed.

6 Claims, 7 Drawing Sheets

(52) U.S. Cl.
CPC ............... *B81B 2201/0242* (2013.01); *B81B 2201/0264* (2013.01); *B81B 2203/033* (2013.01); *B81B 2203/0315* (2013.01); *B81B 2203/0323* (2013.01); *B81B 2203/0338* (2013.01); *B81B 2203/0346* (2013.01); *B81B 2203/0353* (2013.01); *B81B 2207/07* (2013.01); *B81C 1/00047* (2013.01); *B81C 1/00055* (2013.01); *B81C 1/00071* (2013.01); *B81C 1/00087* (2013.01)

(58) Field of Classification Search
CPC .... B81B 2201/0264; B81B 2203/0315; B81B 2207/07; B81B 7/0051; B81B 2203/0323; B81B 2203/033; B81B 2203/0338; B81B 2203/0346; B81B 2203/0353; B81C 1/00047; B81C 1/00055; B81C 1/00063; B81C 1/00071; B81C 1/00079; B81C 1/00087
See application file for complete search history.

(56) References Cited

U.S. PATENT DOCUMENTS

| | | |
|---|---|---|
| 2010/0300201 A1 | 12/2010 | Ge et al. |
| 2014/0374853 A1 | 12/2014 | Weber et al. |
| 2018/0148325 A1* | 5/2018 | Duqi ................. B81C 1/00238 |
| 2019/0161346 A1* | 5/2019 | Lee .................... B81C 1/00293 |
| 2020/0137501 A1* | 4/2020 | Piechocinski ......... B81B 7/0064 |

OTHER PUBLICATIONS

U.S. Appl. No. 15/771,559, filed Oct. 18, 2018, US 2019/0041286 A1, Philippe Robert, et al.
U.S. Appl. No. 16/335,740, filed Mar. 22, 2019, US 2019/0233278 A1, Philippe Robert.
International Search Report dated May 7, 2019 in PCT/FR2018/053435 filed on Dec. 20, 2018, 2 pages.
French Preliminary Search Report dated Sep. 27, 2018 in French Application 1763159 filed on Dec. 22, 2017.

* cited by examiner

USE OF AN UNCOUPLING STRUCTURE FOR ASSEMBLING A COMPONENT HAVING A CASING

TECHNICAL FIELD AND PRIOR ART

The present application relates to the field of systems formed by an assembly of component(s), in particular MEMS (for "microelectromechanical systems") and/or NEMS (for "nano-electromechanical systems") electromechanical components on a support, in particular a circuit package. The package is generally a PCB (for "Printed Circuit Board") but can also be a ceramic package, a metal package or any other type of package or assembly and acts as an interface between the electromechanical component and other components or typically a chip, for example an ASIC ("Application-Specific Integrated Circuit") provided with signal processing means from the MEMS component.

The MEMS and/or NEMS component is made from a substrate and includes at least one generally suspended microsize or nanosize sensitive element. For some applications, the MEMS and/or NEMS component is protected by a cap, so as to place the sensitive element into an enclosure, which can be closed in particular hermetically closed.

The assembly between the MEMS component and the package is often sensitive to mechanical and/or thermal stresses.

Such stresses specially come from the fact that the package material, for example a plastic material, a resin, or a PCB (polychlorobiphenyl), generally has a thermal expansion coefficient much different from that of the material of the component. Other stress change sources can have a negative effect on the assembly.

To overcome this problem, document EP 2 679 536 A2 provides an assembly between a MEMS component protected by a cap and a package by means of an intermediate frame provided with a movable accommodating zone and suspended in the middle of the frame.

Such a frame added between the component and the package has the drawback of increasing the z overall size of the assembly, in other words in the direction in which the thickness also called height of the assembly is measured.

There rises the problem of making an assembly between an NEMS and/or MEMS component and its package associated therewith, which is improved relative to the drawbacks indicated above.

DISCLOSURE OF THE INVENTION

One embodiment of the present invention provides a device comprising: a component, in particular a MEMS and/or NEMS electromechanical component, able to be assembled to a support, the component being provided with at least one sensitive element formed in a first layer of a stack of layers, the component being typically further provided with a protective cap for the sensitive element, the cap being arranged on said stack, the electromechanical component including at least one movable suspended structure provided with one or more attachment zones on which one or more accommodating regions for the support is (are) able to be attached respectively, the suspended structure being formed at least partially in the protective cap or in a second layer of said stack, which second layer is distinct from the first layer.

The support also called package can be in particular an integrated circuit support.

Such a suspended structure enables the component to be mechanically and thermally decoupled from the support or package on which this component is assembled.

The suspended structure is typically adapted to move in the plane in order to relieve mechanical and thermal stresses.

An arrangement in which the decoupling structure is either at least partially integrated into the cap or at least partially integrated into the substrate or into a stack of layers forming the MEMS and/or NEMS component enables the thickness of the assembly between the component and the package not to be increased.

Such an arrangement of the decoupling structure also enables a sufficient area for the sensitive element of the electromechanical component to be kept insofar as the sensitive element and the decoupling structure are provided at different levels or stages as far as the height or thickness of the component is concerned.

When the MEMS and/or NEMS component is a sensor, disturbances or filtering of the physical component to be measured are limited.

The decoupling structure includes at least one suspended element, which can be for example in the form of a spring, or beam, or membrane or beam embedded along one of its ends in the component, and in particular in the cap or substrate of the component, this element being secured to at least one zone called an "attachment zone" through which the component is attached, in particular to the package or printed circuit (PCB).

One embodiment of the suspended structure provides that at least one given attachment zone is kept suspended through one or more beams, one or more trenches being arranged around the beam(s) and this given attachment zone.

Advantageously, the given attachment zone and the beam(s) are connected to a portion of the suspended structure, this portion being surrounded by a trench.

According to an advantageous embodiment, the electric connection between the component and the support is dissociated from the suspended structure. Thus, the suspended structure of the component is arranged at a lower face of the component and the component includes at least one conducting pad disposed on a face opposite to said lower face, the conducting pad being connected to a connection zone for connecting the support through a connection element such as a conducting wire. Making an electric connection through a wire enables the manufacturing cost of the assembled system to be reduced.

According to a possible implementation for which the suspended structure is formed on the second layer of said stack, the conducting pad can be disposed at the bottom of a hole provided in the component, in particular in the protective cap.

According to a possible implementation for which the suspended structure is formed in the protective cap at a lower face of the component, the conducting pad can be arranged on a face of the stack which is opposite to the lower face.

In order to enhance robustness of the assembly, the MEMS and/or NEMS component can further include a rigid attachment zone distinct from the suspended structure.

The suspended structure can further be provided with at least one stop. Such a stop can be provided with a bump shape in order to avoid bonding problems with the rest of the component.

According to another aspect, the present invention relates to an electromechanical system comprising:

a device as defined above, a circuit support assembled to the component of said device.

The assembly is advantageously made through a bonding agent or a soldering or brazing material.

Advantageously, the system is provided with another cap attached to the support and making an enclosure around the component and in particular the protective cap of the sensitive element.

According to another aspect, a method for manufacturing a device as defined above is provided, and wherein making said suspended structure comprises steps of:
   forming at least one buried cavity at a support layer,
   etching this support layer so as to define the suspended structure, etching being made so as to reach the buried cavity so as to release the suspended structure.

After forming the buried cavity and prior to etching the support layer, the method can comprise steps of:
   forming an access pit for accessing the buried cavity,
   forming a protective layer coating the buried cavity.

The method can further comprise transferring at least one superficial layer at a front face of the support layer opposite to its rear face and structuring the superficial layer so as to form the sensitive element, the rear face of the support layer being in this case that at which the suspended structure is defined.

Alternatively, a manufacturing method is provided wherein making the suspended structure comprises steps of:
   forming at least one sacrificial zone on a first face of a given layer,
   forming a semi-conducting layer on this sacrificial zone,
   etching this semi-conducting layer so as to define suspended structure patterns in the semi-conducting layer and etching the sacrificial zone so as to release these patterns.

The sensitive element can then be formed on a layer or a set of several layers disposed on a second face of the given layer, opposite to the first face.

BRIEF DESCRIPTION OF THE DRAWINGS

The present invention will be better understood upon reading the description of exemplary embodiments, given by way of indicating and in no way limiting purposes, making reference to the appended drawings in which.

Identical, similar or equivalent parts of the different figures bear the same reference numerals so as to facilitate switching from one figure to the other.

The different parts represented in the figures are not necessarily drawn to a uniform scale, to make the figures more legible.

Further, in the description hereinafter, terms which depend on the orientation of the structure such as for example "upper", "lower", "rear", "front", "under", "on", "lateral" are applied by considering that the structure is oriented in the illustrated way in the figures.

DETAILED DISCLOSURE OF PARTICULAR EMBODIMENTS

Figure 1:
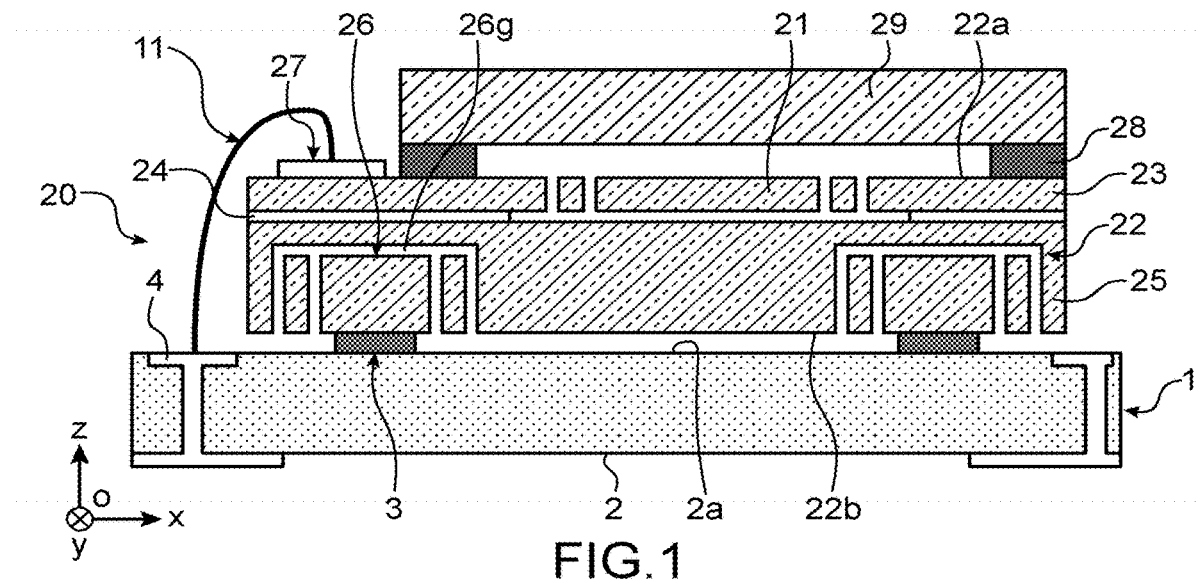
FIG. 1 illustrates an exemplary embodiment of a system in which a MEMS and/or NEMS component is assembled to an integrated circuit support or package through a movable suspended structure made in the thickness of the component itself.

FIG. 1 is now referred to, which illustrates an exemplary device provided with at least one thermal and mechanical decoupling structure as implemented according to one embodiment of the present invention.

The device comprises a component 20, in this example of the electromechanical MEMS and/or NEMS type. The electromechanical component 20 is provided with at least one typically suspended micronize or nanosize sensitive element 21. The sensitive element 21 is made from a substrate 22, that is in a layer or a stack fastened to the same or in the material itself of the same. For example, the sensitive element 21 can be in the form of a membrane or beam, or comb. The component 20 can be provided to perform a sensor function, for example of the accelerometer or gyrometer or pressure sensor or resonator type. The component 20 can also be provided to perform an actuator function for example an actuator for variable focal length optical device.

The substrate 22 of the component 20 is in this example provided with a superficial layer 23 in which the sensitive element 21 is made, with a sacrificial intermediate layer 24, which has been partially etched so as to allow release of the sensitive element 21, and with a support layer 25 one face of which here forms a rear face 22b of the substrate 22 and of the component 20.

The substrate 22 can be for example a bulk substrate or a semi-conductor-on-insulator type substrate such as an SOI substrate, with a semi-conducting superficial layer 23 lying on an insulating intermediate layer 24, itself lying on a semi-conducting support layer 25.

A protective cap 29 for the sensitive element 21 is provided. This cap 29 is disposed in this example on the superficial layer 23 of the substrate 22 and forms a front face 22a of the component 20, which is opposite to the rear face 22b. The cap 29 can be made for example of a metal, or ceramic, or plastic material, or advantageously a semi-conductor material. The cap 29 is arranged such as to make a protective enclosure around the sensitive element 21. The cap 29 can be free of opening and enable a closed hermetic enclosure in which the sensitive element 21 is disposed to be formed. The cap 29 can be connected to the substrate 22 through a sealing bead 28, for example made of AlGe.

The electromechanical component 20 is itself assembled to a support 1, also called a package 1, which can be formed for example by a substrate 2 of polymeric or ceramic or metal material. Typically, the support 1 is an integrated circuit package used as an interface between the electromechanical component 20 and a printed circuit also called PCB ("Printed Circuit Board") or an assembly of other components.

The support 1 includes accommodating regions 3 for the electromechanical component 20, here in the form of pads 3 on which attachment zones 26a for the component are disposed. The attachment zones 26a and accommodating regions 3 are typically made integral with each other by bonding or soldering or brazing. A bonding agent, for example of polymeric material or a soldering or brazing material is thus interposed between the attachment zone 26 and the accommodating region 3 on which this attachment zone 26 is disposed.

The attachment zones 26a distributed at the rear face of the component 20 are part of a movable suspended structure 26. This suspended structure 26 is in particular free to move in the plane, in other words in a direction parallel to the main plane of the substrate 22, that is a plane passing through the substrate 22 and parallel to the plane [O; x; y] of the orthogonal frame of reference [O; x; y; z].

The suspended structure 26 is in this example housed at least partially in a cavity provided in the support layer 25 of the substrate 22. The suspended structure 26 enables flexible parts to be formed at one or more locations for attaching the support 1 and the component 20.

The suspended structure 26 enables a mechanical and thermal decoupling means to be made between the support 1 and the component 20. This decoupling means enables all or part of the mechanical and thermal stresses occurring for example upon assembling the support 1 and the component 20 to be absorbed or compensated for. This decoupling means also enables effect of so-called "thermal" stresses, specifically related to a difference in thermal expansion coefficient between the component 20 and the package or support 1 to be limited.

A disposition of the decoupling structure 26 in the thickness of the substrate 22, without using a further intermediate fastened support or element, enables the z-overall size to be limited. The decoupling structure 26 is advantageously provided in a layer 25 of the substrate 22 different from the layer 23 in which the sensitive element 21 is made, which enables sufficient room for the sensitive element 21 to be kept, and its operation not to be disturbed.

In this exemplary embodiment, the electric connection between the electromechanical component 20 and the support 1 is advantageously dissociated from the attachment locations, in other words from the decoupling structure 26, which enables the manufacturing cost for the connections to be reduced. Thus, the soldering or brazing or bonding material between an accommodating region 3 and an attachment zone 26a for the component 20 enables the latter to bond the latter with the support 1 without conveying an electric signal. The material located at the interface between the accommodating region 3 and the attachment zone 26a can thus be possibly insulating. For example, the use of a polymeric bonding agent can be provided.

To ensure electric connection between the component 20 and the support 1, at least one conducting pad 27 is provided on the component 20 for being electrically connected to a contact pad of the support 1. The conducting pad 27 is disposed on a face opposite to the rear face 22b of the component 20. In this example, at least one pad disposed on the superficial layer 23 is provided.

To make the electric connection between the component 20 and the support 1 easier, one or more conducting elements extending around the component 20 without passing through its thickness can be provided. Typically, a connection is set up using at least one conducting wire 11 which connects the conducting pad 27 with a conducting zone 4 or contact pad 4 for the support 1. This conducting zone 4 is here located on an upper face 2a of the support, that is the face on which the accommodating pads 3 are arranged.

Figures 2, 3:
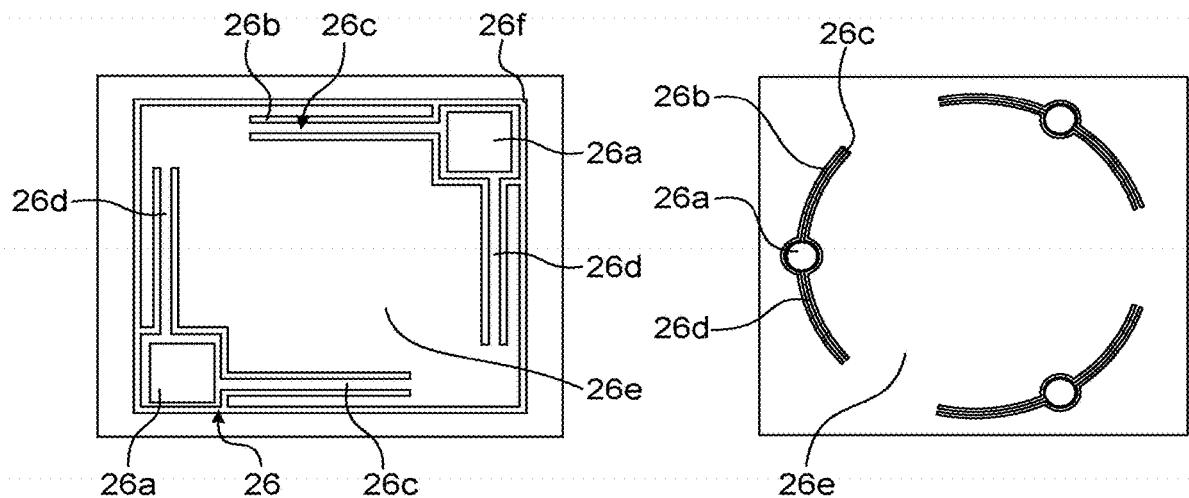
FIG. 2 illustrates a particular exemplary embodiment of the suspended structure.
FIG. 3 illustrates another particular exemplary embodiment of the suspended structure.

FIG. 2 represents a first exemplary embodiment of the suspended structure 26 allowing mechanical and thermal decoupling between component 20 and support 1.

The attachment zones 26a on which regions for accommodating the support 1 are to be assembled are here disposed at the periphery of the rear face of the component 20.

Each attachment zone 26a has in this particular example a rectangular shape and is connected to the rest of the component 20 through suspended beams 26c, 26d each secured through an anchoring point located in a central portion 26e itself secured to the component 20. The beams 26c, 26d here extend in directions not parallel to each other. In this particular exemplary embodiment, two rectilinear suspended beams 26c, 26d orthogonal to each other are secured to the side edges of a same attachment zone 26a. To allow a movement of the beams 26c, 26d and the attachment zone 26a associated therewith, trenches 26b which extend around the beams 26c, 26d and the attachment zone 26a are provided.

In this first exemplary embodiment, at least one further trench 26f communicating with the other trench(es) 26b is also disposed around the portion 26e of the component 20 to which the beams 26c, 26d are secured, thus permitting movement in the plane of this portion 26e. The decoupling structure 26 can be provided with a different number of beams and attachment zones. Likewise, other shapes for the beams 26c, 26d, and other shapes for the attachment zones 26a can be provided.

Another exemplary embodiment of a suspended structure 26 illustrated in FIG. 3, provides several disc-shaped attachment zones 26a, each secured to the rest of the component 20 through curve-shaped beams 26c, 26d. The attachment zones 26a and associated beams 26c, 26d are here distributed around a circular-shaped central portion 26e of the component and more particularly along the circumference of this central portion 26e. The trenches 26b disposed on either side of the beams 26c and attachment zones have in this example a constant cross-section and a shape snugly fitting that of the perimeter of the attachment zones 26a and their associated beams 26c, 26d.

Mechanical decoupling between the support 1 and the component 20 can be made at all the attachment locations between the component 20 and the support 1 or only at part of these locations. Thus, according to an alternative implementation illustrated in FIG. 4, the component 20 includes a further attachment zone 126a, here a rigid one, assembled to an accommodating region 3 for the support 1. Unlike the decoupling structure 26, this zone 126a is fixed relative to the rest of the component 20 and forms a rigid anchoring point for the support 1. This enables robustness of the assembly to be improved.

The further attachment zone 126a and the accommodating region for the support 1 are also typically joined through gluing or soldering or brazing.

The further attachment zone 126a can be provided in a central part of the rear face of the component 20, whereas the attachment zones 26a of the suspended structures are disposed around this central part. In this particular exemplary embodiment, the attachment zone 126a is in the form of a pad machined in the support layer 25 of the substrate 22. The pad 126a is here surrounded with grooves or trenches 126b. These grooves 126b enable transmission of mechanical and thermal stresses to the rest of the structure to be limited.

Figure 4:
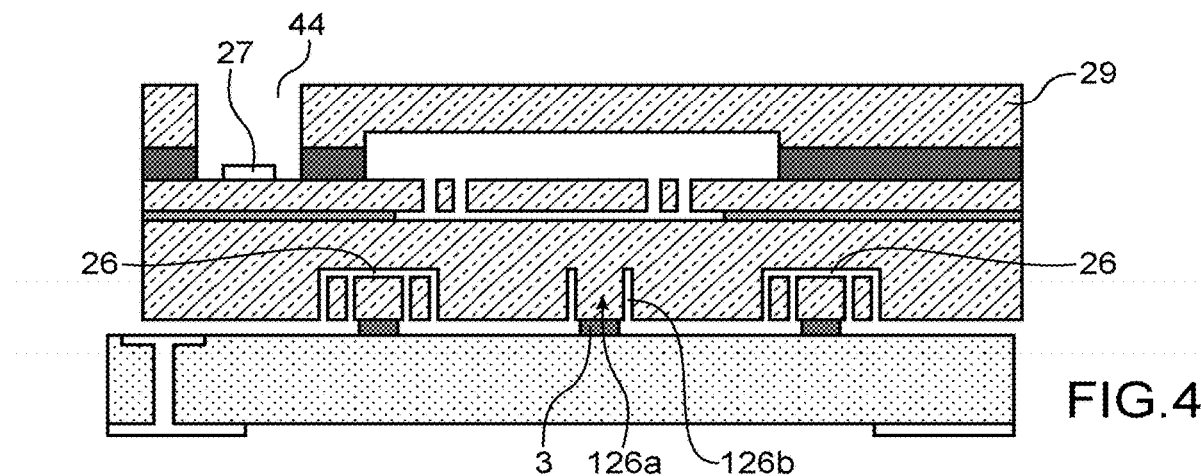
FIG. 4 illustrates a particular exemplary embodiment in which assembling between the MEMS and/or NEMS component and the package is further ensured through a rigid part.

FIG. 4 also illustrates another arrangement of the front face of the component 20 which includes this time a hole 44 revealing a conducting pad 27 for being connected to the support 1 or package 1.

Another way of reducing z-overall size of the component 20 while providing it with at least one decoupling structure 26 is to arrange this structure 26 in the protective cap 29 of the sensitive element. Thus, according to another alternative embodiment illustrated in FIG. 5, the protective cap 29 is machined so as to include at least one decoupling structure 26. The cap 29 this time forms the rear face 20b of the component 20 that is assembled against the support 1.

The substrate 22 is also turned over, the face of the support layer 25 farthest from the sensitive element 21 forming the front face 20a of the component 20. The conducting pad(s) 27 for being connected to the support 1 is (are) disposed at the front face 20a of the component 20, but this time on the support layer 25 of the substrate 20. To electrically insulate a conducting pad 27 from the rest of the substrate, trenches 54 can be provided around the conducting pad 27. These trenches 54 can possibly be plugged by an insulating material for example of the polymeric type or a stack including an insulating material for example a stack of $SiO_2$ and polycrystalline Si.

Figure 5:
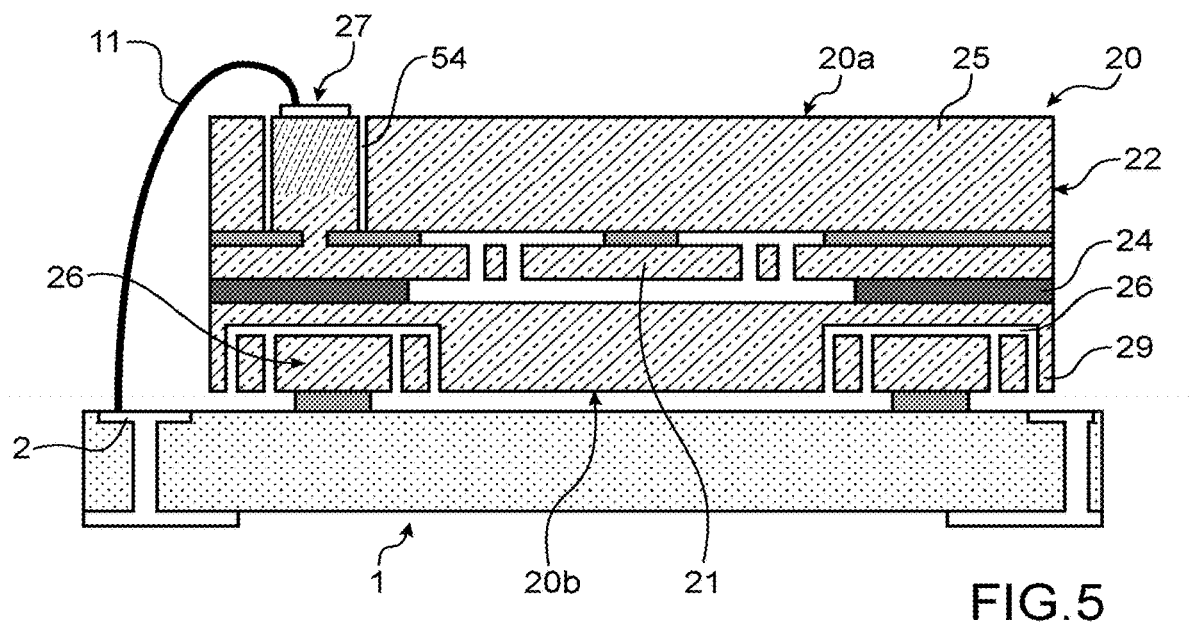
FIG. 5 illustrates a particular exemplary embodiment in which the movable suspended structure is made in a protective cap of a sensitive element of the MEMS and/or NEMS component.

In the exemplary embodiment of FIG. 5, these trenches 54 extend up to the intermediate layer 24.

In this exemplary embodiment like in the previous examples, the decoupling structure 26 is advantageously arranged in a level of the electromechanical component 20 which is different from that in which the sensitive element 21 is located in order to dedicate more space to the same.

For avoiding inopportune bonding of the decoupling structure 26 to parts of the component 20, one or more stops can be provided in the space, as trenches and/or cavities in which the structure 26 is to be moved. In particular, anti-bonding side stops can be provided when the decoupling structure 26 moves in the plane.

Figure 6:
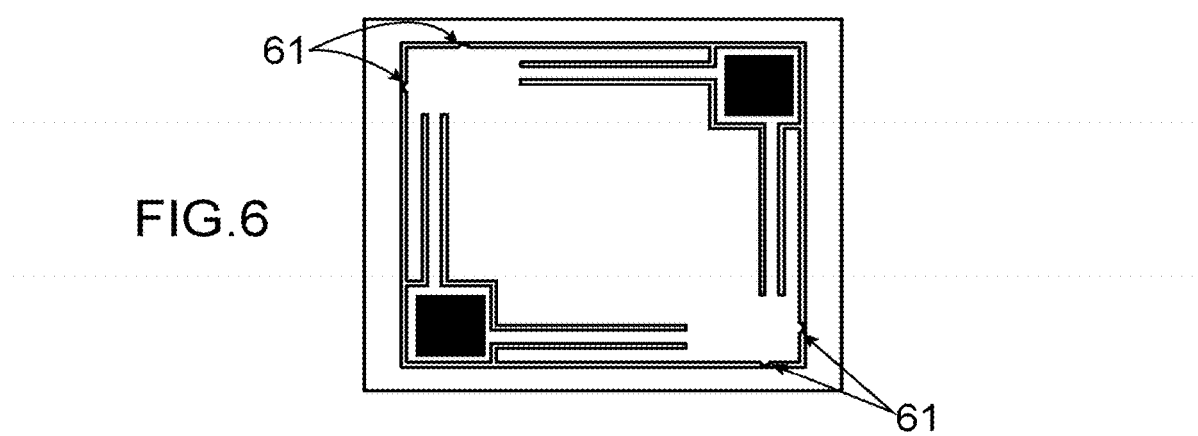
FIG. 6 illustrates a particular exemplary embodiment in which the suspended structure is provided with one or more stop-forming elements.

The exemplary embodiment illustrated in FIG. 6 repeats an arrangement of the decoupling structure 26 similar to that previously described in connection with FIG. 2, but this time with stops 61 as protrusions disposed on the side perimeter of the portion 26e secured to the rest of the component 20.

An exemplary method for manufacturing and electromechanical component will now be described in connection with FIGS. 7A-7F, 8A-8B and 9A-9B.

Figure 7A:
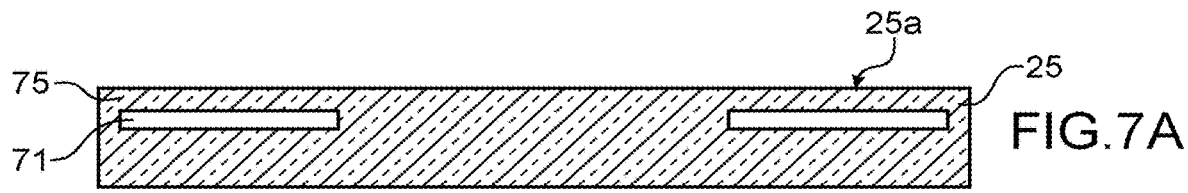
FIGS. 7A-7F, 8A-8B, 9A-9B, 10A-10D are used to illustrate an exemplary method for manufacturing a device with a MEMS and/or NEMS component assembled to a package through a suspended decoupling structure.

A possible start structure of the method is illustrated in FIG. 7A in the form of a substrate provided with a support layer 25, in which buried cavities 71, that is closed cavities disposed in the thickness of the support layer 25 are made. Such cavities 71 are delimited by suspended membranes 75 arranged at a front face 25a of the support layer 25. The support layer 25 is typically a silicon bulk substrate.

Figures 8A, 8B:
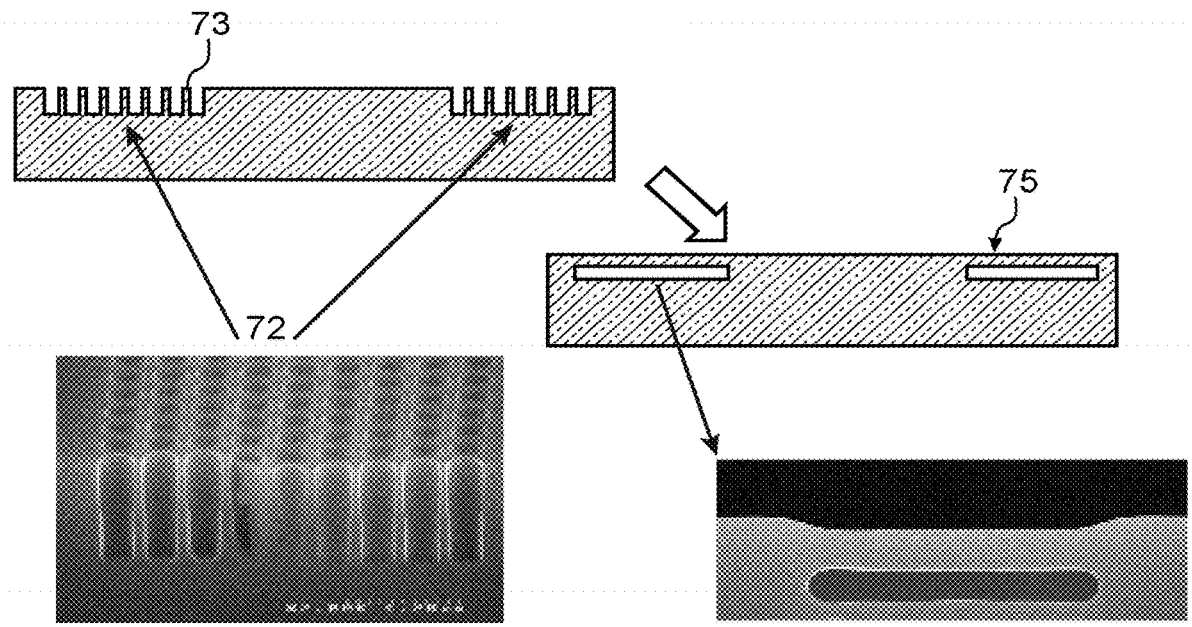

To make such membranes 75, an SON ("Silicon on Nothing") type technique can for example be employed, some steps of which are given in FIGS. 8A-8B.

In FIG. 8A, zones 72 formed by a plurality of thin pillars 73 disposed at a short distance from each other are represented.

The pillars 73 have for example a width between about 0.5 μm and 2 μm and are disposed at a distance between about 0.3 μm and 1 μm from each other.

To make these pillars 73, during a step, a mask is made by photolithography on the surface of the support layer 25. At a level where a region formed by pillars should be made, the mask defines for example a honeycomb array.

This mask delimits inter-pillar zones to be etched. The width of the inter-pillar zones d is for example between 0.3 μm and 1 μm and the distance D between two parallel faces of a pillar is for example between 0.5 μm and 2 μm.

A step of etching the support layer 25 then takes place, for example of the DRIE type with time stop, on a depth typically between 0.5 μm and 2 μm.

The structure schematically represented in FIG. 8A is then obtained.

During a next step, the mask is removed.

The layer thus formed has a thickness typically between 1 μm and a few tens μm.

After epitaxy, a high temperature annealing at a temperature close to the melting temperature of said material in the case of Si pillars, is performed, the temperature is about 1200° C., which makes the pillars 73 collapse. A suspended membrane 75 is then formed (FIG. 8B).

A chemical mechanical planarization can be performed to improve surface state and possibly thin down the thickness of this membrane 75.

If necessary, a deposition or epitaxy of a semi-conductor material can then be made if necessary in order to thin down the membrane 75.

An access pit 76 to the buried cavity 71 is then made. This can be implemented by forming a hole through the membrane 75 and revealing the buried cavity 76.

A protective layer coating the cavity 71 is then formed. This layer is typically formed by oxidising the semi-conductor material of the support layer 25. The walls of the cavity 71 are thus covered with a silicon oxide layer 77 when the support layer made is of silicon (FIG. 7B).

Figure 7B:
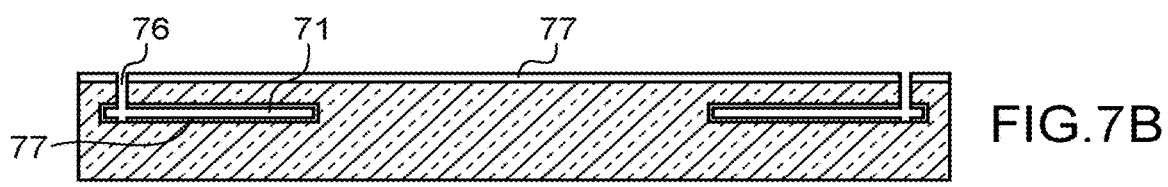

An oxide layer 77 formed at the surface of the support layer can in turn be kept as in FIG. 7B or be removed if necessary.

Figure 7C:
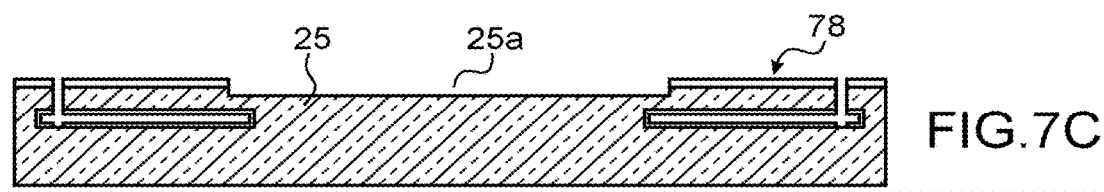

According to a subsequent step illustrated in FIG. 7C, part of the support layer 25 is followed at its front face 25a. This can be performed using photolithography and etching steps. Etching is performed so as to keep non-etched parts 78 at the front face 25a.

Figure 7D:
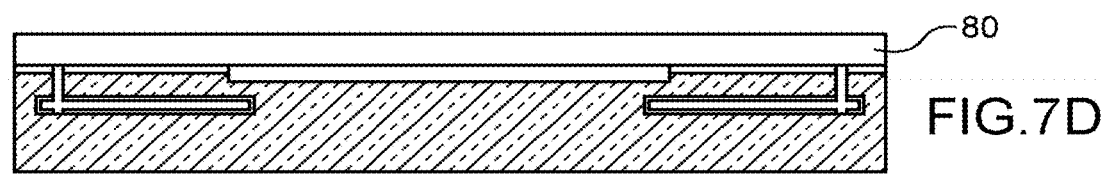

These parts 78 form abutment zones on which a substrate or a layer or a wafer 80, typically a semi-conducting wafer is fastened by sealing, or direct bonding (FIG. 7D). A thickness of the layer 80 or secured layer 80 or wafer can then be removed.

Figure 7E:
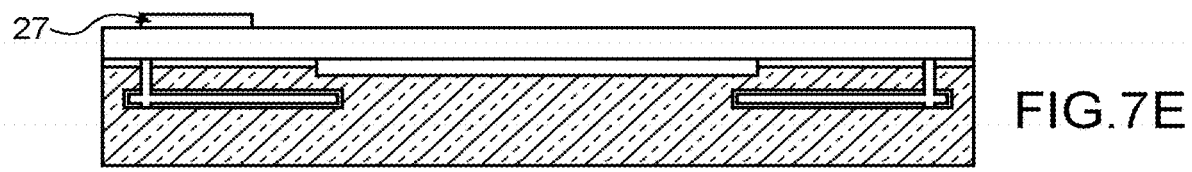

At least one conducting pad 27 is then formed on the fastened wafer 80 or layer 80. The pad 27 is typically made by photolithography and then etching a metal material or a stack of metals, for example formed by W/WN/Au (FIG. 7E).

Figure 7F:
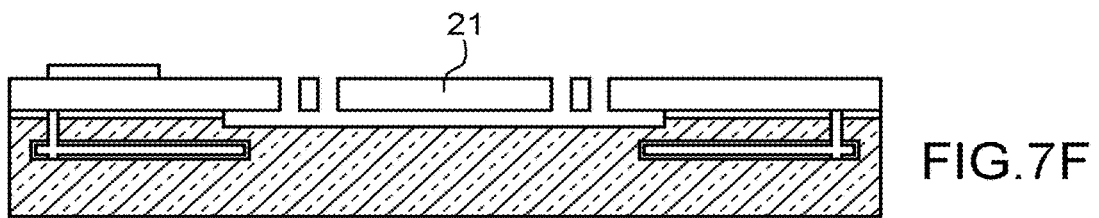

The layer or wafer 80 is then structured to form the sensitive element 21. For this, photolithography and etching steps can be performed (FIG. 7F).

On the electromechanical component thus made, a protective cap 29 for the sensitive element 21 can be fastened.

Figure 9A:
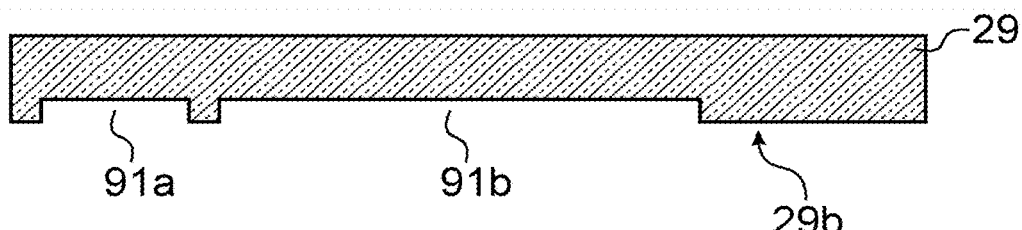

A step of structuring the cap 29 is illustrated in FIG. 9A.

One or more locations 91a, 91b are thus formed, for example by photolithography and etching, in the thickness of the cap 29 at a face 29b thereof. Structuring the locations 91a, 91b can require removing a thickness in the order of several micrometres for example in the order of 20 μm.

Figure 9B:
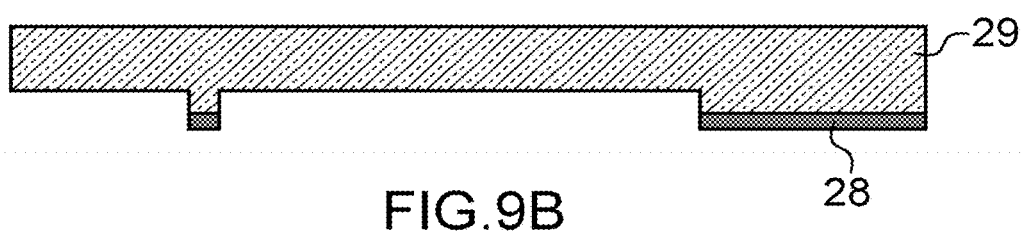

In FIG. 9B, the cap 29 is provided with a sealing bead 28, for example formed by depositing a polymeric material. The sealing bead 28 is in particular made on projecting parts of the structured face 29b of the cap 29.

An assembly between a stack of layers as previously made is then performed and in which a sensitive element 21 has been formed, and a protective cap 29 as previously described, in order to complete manufacturing of the electromechanical component.

Figure 10A:
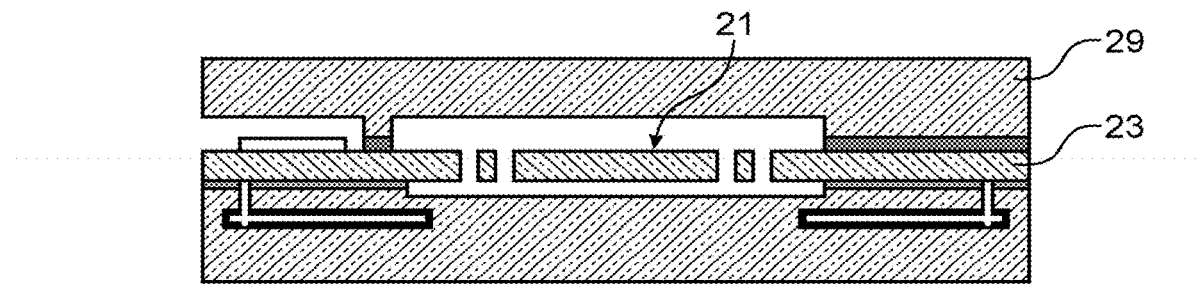

In the example illustrated in FIG. 10A, the protective cap 29 is arranged on the superficial layer 23 in which the sensitive element 21 is made.

Figure 10B:
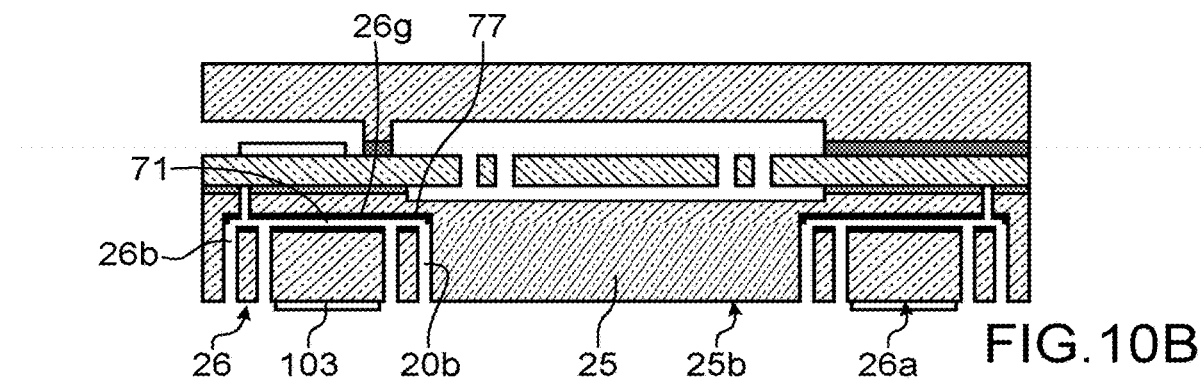

FIG. 10B illustrates an exemplary embodiment of the decoupling structure 26 by forming patterns in the support layer 25, in particular at its rear face 25b. Structuring the patterns is typically performed by photolithography and then etching until the buried cavities 71 are revealed. Etching is for example made using a DRIE ("Deep Reactive Ion Etching") type silicon etching equipment when the support layer is made of silicon. Advantageously, the protective layer 77, for example of silicon oxide, coating the buried cavity 71 acts as an etching stop layer. The decoupling structure 26 is delimited by trenches 26b communicating with the buried cavity 26g.

Then, in a zone 26a of the component called an attachment zone, a material 103 is formed to allow bonding or assembling through soldering or brazing between this attachment zone 26a and an accommodating region (not represented in this figure) for a support with which this attachment zone is to be made internal. When an assembly by soldering or brazing is performed, the material 103 can be in the form of a metal pad, such as for example a thin layer of gold (Au). The soldering or brazing material can be for example SnAg. A metal finish, for example based on Au is generally provided on the PCB at the soldering or brazing zone.

Figure 10C:
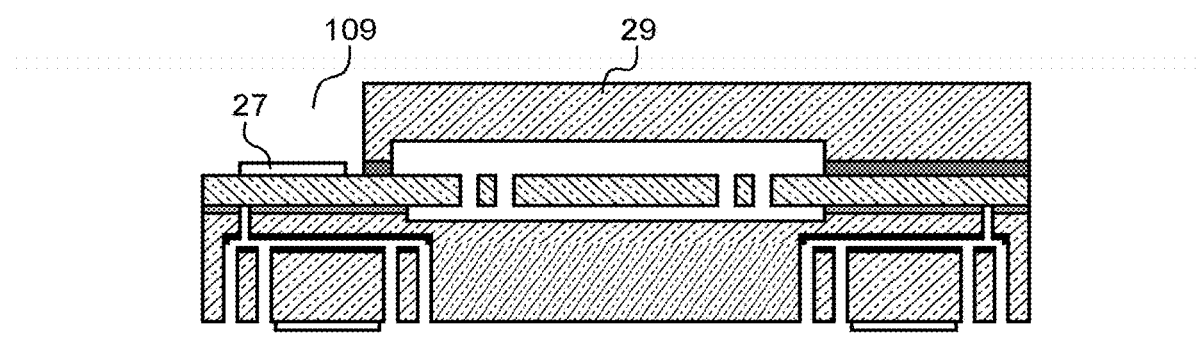

Optionally (FIG. 10C), at least one opening 109 can then be made in the cap 29, in order to reveal a part of the superficial layer 23, in particular a part on which at least one conducting pad 27 for being electrically connected to the integrated circuit support lies. Access to the conducting pad 27 can be made for example by sawing the cap 29.

Figure 10D:
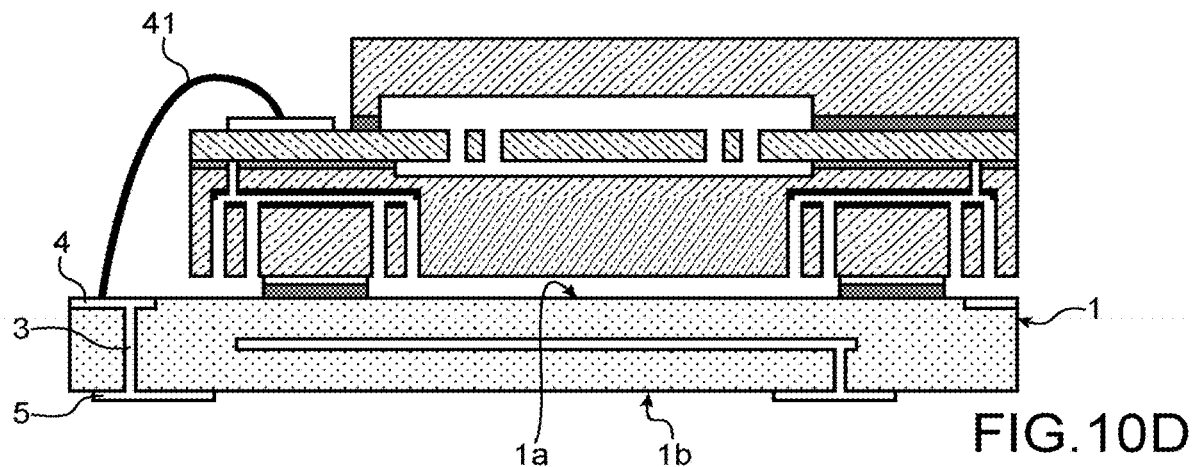

A step of assembling the MEMS and/or NEMS component and an integrated circuit support is illustrated in FIG. 10D. After assembly typically made by bonding or soldering or brazing, a connection is set up between at least one conducting pad 27 of the component 20 and a contact pad 2 of the support 1. The connection can be performed by means of a wire bonding method that can be implemented in order to make a conducting wire 11 connecting the front face of the electromechanical component 20 and the upper face 1a of the support 1 that are substantially parallel but located at different levels from each other.

In the exemplary assembly illustrated in FIG. 10D, the support 1 or package 1 is provided with a contact pad 5 located at a lower face 1b of the support 1 and which is connected to the contact pad 4 disposed at an upper face 1a through a connecting structure passing through the thickness of the support.

Another manufacturing method the steps of which are illustrated in FIGS. 11A-11F and 12, provides implementing the decoupling structure(s) 26 on a layer 110 or a substrate 110 on which the sensitive element 21 is also formed.

On a face, in particular the rear face 110b of the semi-conducting substrate, one or more sacrificial zones are first formed.

Figure 11A:
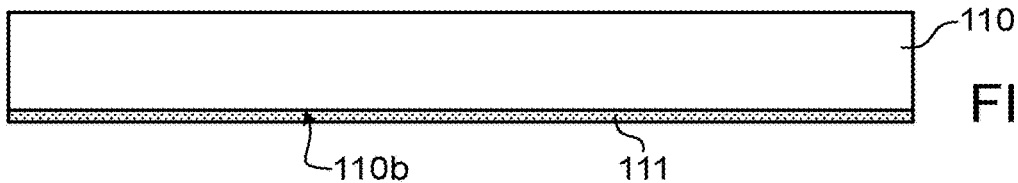
FIGS. 11A-11F, 12 are used to illustrate another exemplary method for manufacturing a device with a MEMS and/or NEMS component assembled to a package through a suspended decoupling structure.
Figure 11B:
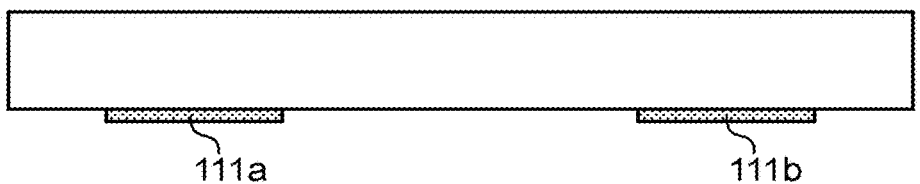
Figure 11C:
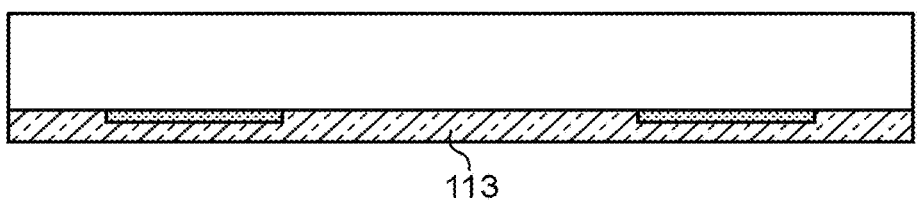

This can be performed for example as in FIG. 11A, by performing thermal oxidation so as to form a sacrificial oxide layer 111. The sacrificial layer 111 can be provided with a thickness for example in the order of one micrometre.

Optionally (FIG. 11B), this layer 111 can then be structured, for example by photolithography and etching, so as to form distinct sacrificial zones 111a, 111b.

On the rear face 110b of the substrate 110, a semi-conducting layer 113 is then made. This layer, for example of silicon or polysilicon or polycrystalline SiGe can be formed by epitaxy. The semi-conducting layer 113 can be provided with a thickness for example in the order of about ten micrometres. A planarization of this layer 113 can then be performed for example by CMP polishing.

Figure 11D:
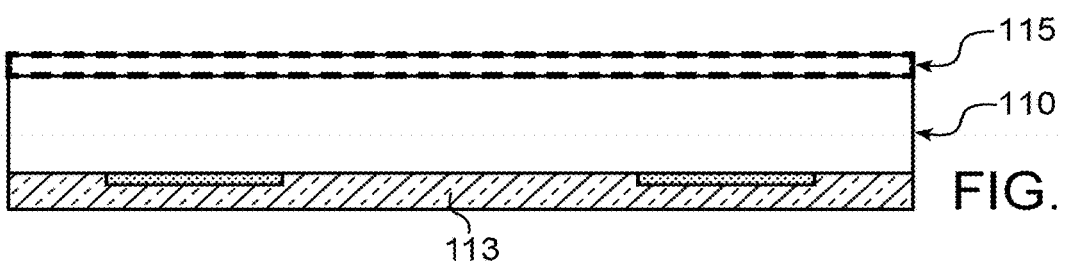

In the example illustrated in FIG. 11D, a layer 115 (or a stack) of layer(s) in which the sensitive element of the component is made, is fastened to the front face 110a of the substrate 110.

The sensitive element is however preferably directly made on the substrate 110. In the case where the substrate 110 is a semi-conductor on insulator substrate, for example SOI (Silicon On Insulator), the layer 115 in which the sensitive element corresponding to the superficial thin layer of the SOI substrate is made.

Figure 11E:
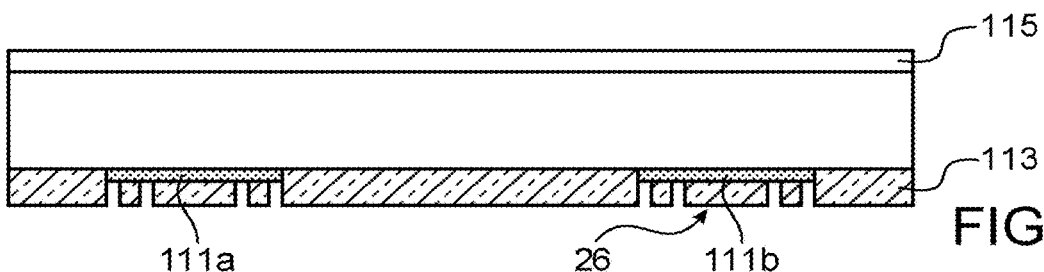

FIG. 11E in turn shows a step of structuring the decoupling structure(s) 26 in the layer 113 located at the rear face 110b of the substrate 110. This can be made by photolithography and then etching by using sacrificial zones 111a, 111b as etch stop zones.

Figure 11F:
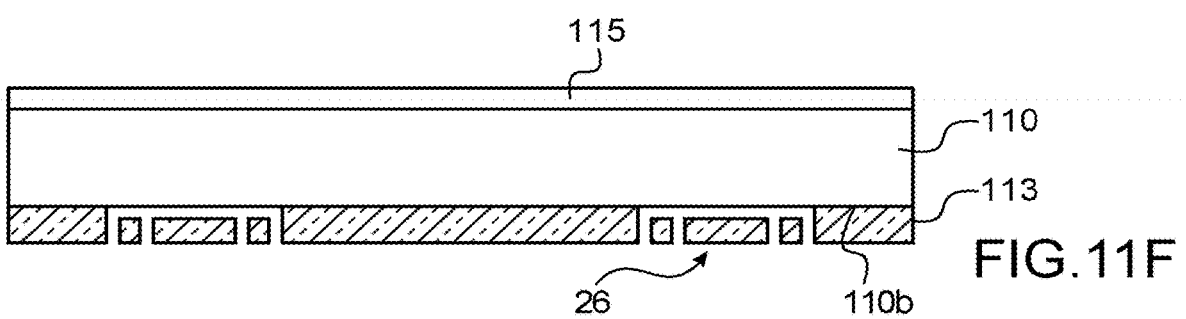

A step of releasing the decoupling structure 26 by etching the sacrificial zones 111a, 111b is illustrated in FIG. 11F. For example, to release silicon oxide sacrificial zones 111a, 111b, HF as vapour can be used. During this release, the layer 115 or stack 115 can be protected, for example by using a temporary protective layer for example through a polymeric layer deposited by lamination and which can be then removed once the release is performed.

Figure 12:
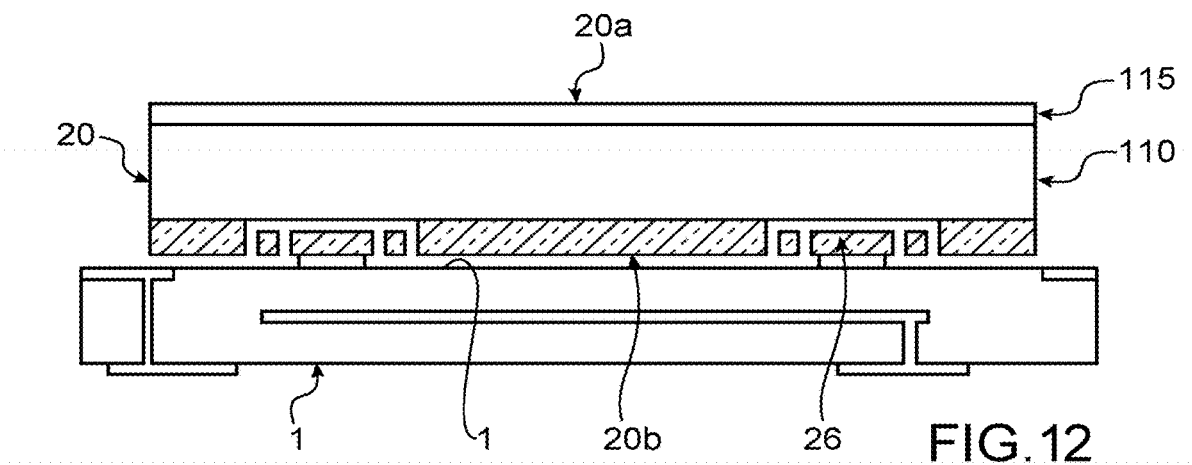

An assembly of the component 20 on a support 1 for example of the PCB type is then illustrated in FIG. 12. The rear face 20b of the electromechanical component 20 on which the decoupling structure 26 is located is fastened to the upper face 1a of the support 1, whereas the front face 20a of the component 20 forms the front face of the system once the assembly is made.

Figure 13:
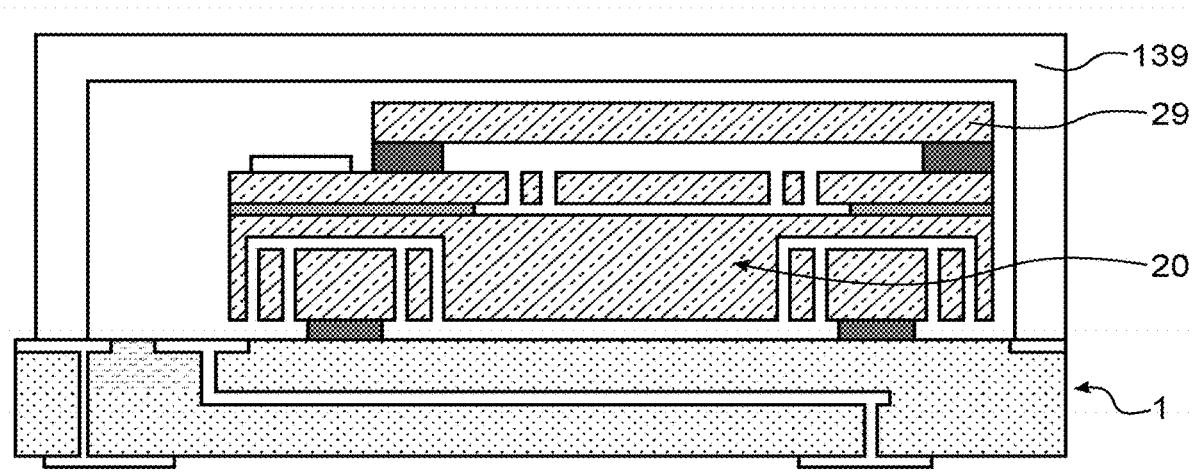
FIG. 13 illustrates an exemplary embodiment of a system in which a MEMS and/or NEMS component provided with a first protective cap of its sensitive element is assembled to a package through a suspended structure and protected by another protective cap disposed on the package and forming an enclosure around the first protective cap.

The system formed by the package 1 or support 1 assembled to the component 20 can itself be protected using a further cap 139 arranged on the package and extending around the component 20 and the cap 29 of this component. Such an arrangement is illustrated for example in FIG. 13.

The invention claimed is:

1. A method for manufacturing a device comprising a MEMS or a NEMS electromechanical type component, the component being configured to be assembled to a support, in particular an integrated circuit support, the component being provided with at least one sensitive element formed in a first layer of a stack of layers, the electromechanical component including at least one movable suspended structure provided with one or more attachment zones on which one or more accommodating regions for accommodating the support is able to be attached, the suspended structure being formed at least partially in a second layer of said stack, the second layer being distinct from the first layer, the method comprising:

forming the suspended structure comprising steps of:
  forming at least one buried cavity in a support layer,
  forming an access pit to the buried cavity, forming a protective layer coating the buried cavity, and etching the support layer so as to define the suspended structure, wherein the etching reaches the buried cavity so as to release the suspended structure.

2. The method according to claim 1, wherein the suspended structure is defined at a rear face of the support layer, the method further comprising transferring at least one superficial layer at a front face of the support layer opposite to said rear face and structuring the superficial layer so as to form the sensitive element.

3. The method according to claim 1, wherein the support layer is made of a semiconductor material, the protective layer being formed by oxidizing the semiconductor material of the support layer.

4. The method according to claim 1, comprising forming the suspended structure to have at least one stop.

5. The method according to claim 1, the support layer being a layer of a semiconductor on insulator type substrate provided with a semiconducting superficial layer lying on an insulating intermediate layer, said insulating intermediate layer lying on a semiconducting support layer.

6. The method according to claim 1, wherein said component is one of an accelerometer, gyrometer, pressure sensor and resonator.

* * * * *